(12) United States Patent
Gore et al.

(10) Patent No.: US 6,424,515 B1
(45) Date of Patent: Jul. 23, 2002

(54) COMBINED DETECTOR CAPACITOR AND VACUUM FEED THROUGH

(75) Inventors: Nigel P. Gore, San Jose; Alan E. Schoen, Saratoga, both of CA (US)

(73) Assignee: Finnigan Corporation, San Jose, CA (US)

( * ) Notice: Subject to any disclaimer, the term of this patent is extended or adjusted under 35 U.S.C. 154(b) by 0 days.

(21) Appl. No.: 09/705,470

(22) Filed: Nov. 2, 2000

(51) Int. Cl.[7] .................................................. H01G 4/35
(52) U.S. Cl. ..................... 361/302; 361/301.1; 361/277; 361/279; 361/303
(58) Field of Search ............................. 361/302, 301.1, 361/301.2, 304, 279, 277, 283.1, 287, 278, 289, 290, 303

(56) References Cited

U.S. PATENT DOCUMENTS

| | | | | |
|---|---|---|---|---|
| 4,007,406 A | * | 2/1977 | Weisbrod ..................... 317/245 |
| 4,914,543 A | * | 4/1990 | Carroll et al. ............... 361/294 |
| 4,924,701 A | * | 5/1990 | Delatorre ..................... 73/151 |
| 5,546,058 A | * | 8/1996 | Azuma et al. ............... 333/183 |
| 5,735,884 A | * | 4/1998 | Thompson et al. ........... 607/36 |
| 5,825,608 A | * | 10/1998 | Duva et al. ................. 361/302 |
| 6,064,559 A | * | 5/2000 | Church, Jr. ................. 361/277 |
| 6,349,025 B1 | * | 2/2002 | Fraley et al. ............... 361/302 |
| 6,351,368 B1 | * | 2/2002 | Kim ............................ 361/302 |

* cited by examiner

Primary Examiner—Dean A. Reichard
Assistant Examiner—Nguyen Ha
(74) Attorney, Agent, or Firm—Dorsey & Whitney LLP

(57) ABSTRACT

A capacitor for connecting to components within a vacuum system in which the space between the capacitor plates is at the pressure of the vacuum system is provided. One of the be plates provides a feed-through which permits closer coupling of the capacit or to other circuits the system and also eliminates the need for additional components. The capacitor can be a mounted and thus thermally coupled to a vacuum manifold which provides temperature stabilization.

5 Claims, 1 Drawing Sheet

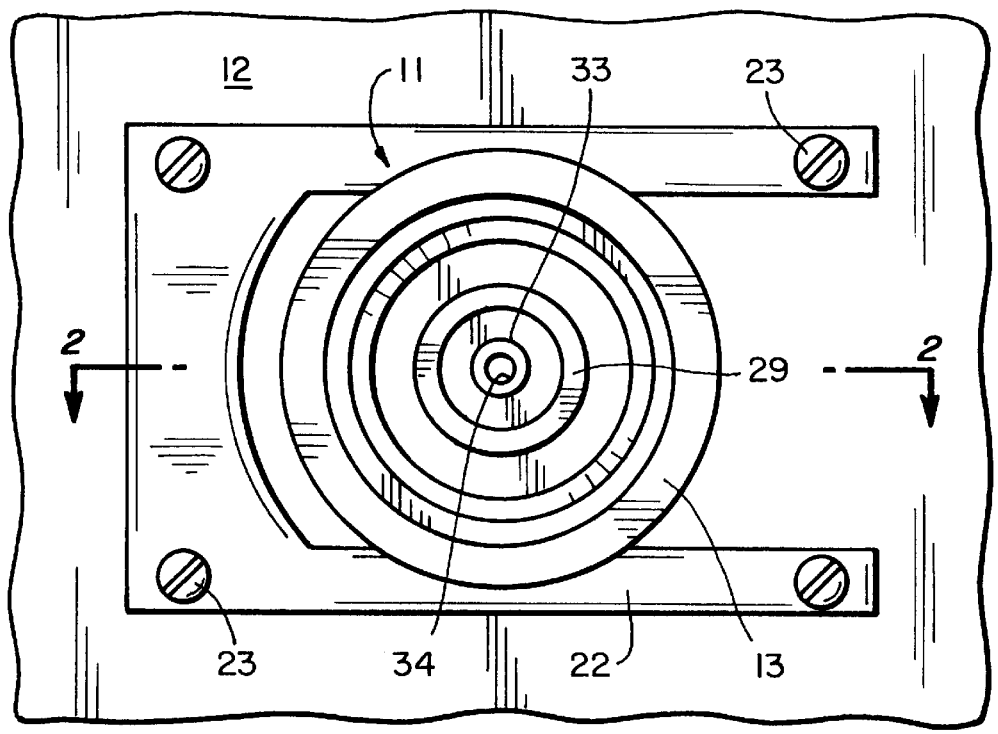
FIG_1
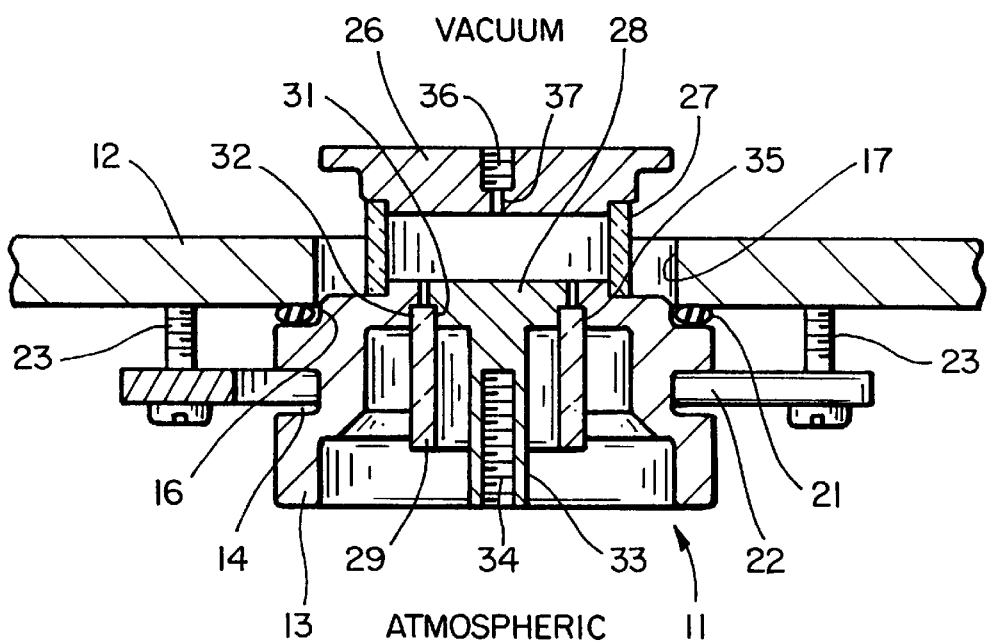
FIG_2

COMBINED DETECTOR CAPACITOR AND VACUUM FEED THROUGH

BRIEF DESCRIPTION OF THE INVENTION

This invention relates to capacitors for detecting voltages applied to components in a vacuum enclosure.

BACKGROUND OF THE INVENTION

Mass spectrometers are instruments for analyzing the chemical composition of matter, usually by using electric or magnetic fields to separate ionized particles by their mass-to-charge ratio. For example, in a quadrupole mass spectrometer, the separation is achieved by driving two pairs of electrodes, one pair driven with a selected radio frequency RF voltage summed with a positive direct current DC voltage, and the other pair driven with the 180° out-of-phase RF signal summed with a negative direct current (DC) voltage.

Accurate measurement of the level of RF voltage driving the electrodes is vital to the success of mass spectrometers, both to provide feedback to the RF circuit to ensure the level of RF is the desired level, and to provide the information to the DC control circuit to ensure that the desired ratio of RF to DC voltage is maintained.

Detector capacitors are used to detect the input RF voltage applied to the pairs of rods and provide an output current which is representative of the input RF voltage. The output current is applied to RF and DC control circuits which control the RF and DC input to the mass spectrometer.

Prior art detector capacitors operate at atmospheric pressure and incorporate features which ensure that the capacitance does not change with temperature changes. One prior art design of a detector capacitor uses low thermal coefficient of expansion metal (e.g. Invar composition 36% Ni balance iron) with insulating parts made of low thermal coefficient of expansion insulator (e.g. Quartz or Alumina). Another prior art design uses materials where the coefficient of expansion are arranged so that changes in dimensions act to cancel any change in capacitance.

SUMMARY OF THE INVENTION

The present invention provides a capacitor which is adapted to be mounted on the wall of a vacuum enclosure, such as the manifold of the mass spectrometer evacuation system, with the capacitor plates inside the enclosure, so that the space between the plates is evacuated by the vacuum system, and a feed-through provides a connection to one of the capacitor plates.

DESCRIPTION OF THE INVENTION

The invention will be clearly understood from the following description when read in connection with the accompanying drawings in which:

FIG. 1 is a plan view showing a detector capacitor mounted on the wall of a vacuum enclosure.

FIG. 2 is a sectional view taken along the line 2.2 of FIG. 1.

DESCRIPTION OF THE INVENTION

Reference is made to FIGS. 1 and 2 where a detector capacitor 11 is shown mounted on the wall 12 of a vacuum enclosure, such as the enclosure for a mass spectrometer. The capacitor includes a cylindrical support body 13 which, in one embodiment, includes a groove 14. One end of the body has a portion of reduced diameter 16 which can extend into a hole 17 formed in the vacuum enclosure 12. A ledge is defined by the portion of reduced diameter. An o-ring 21 is seated in the ledge and engages the wall 12. The body 13 is held against the vacuum enclosure by a bracket 22 which engages the groove 14 and is secured to the wall 12 by screws 23. Tightening of the screws forms a vacuum seal between the body 13 and the wall 12 by means of the o-ring 21.

One plate of the capacitor from the support body 13 by a standoff insulating sleeve 27. The insulting sleeve 27 is made of a suitable insulating material such as ceramic, quartz, fused silica, and the like. The ends of the sleeve are suitably secured to the capacitor plate 26 and support body 13 as for example by brazing or adhering with a suitable adhesive.

The other capacitor plate 28 is supported spaced from the first plate by an isolating sleeve 29. More particularly, the plate includes a flat front surface facing the plate 26, and a portion of reduced diameter 31 which forms a ledge which receives the end of the isolating sleeve 29. The inner surface of the sleeve is secured, as by adhesive, brazing or the like, to the capacitor plate to form a vacuum seal. The capacitor plate 28 includes a post 33 which can include a tapped hole 34 for receiving a screw.

The outer edge 32 of the end of the insulating sleeve 29 is received in the ledge 35 formed in the support body 13 and are suitably secured thereto to form a vacuum seal. It is apparent that the isolating sleeve can be a short sleeve or ring providing the necessary seal and support. Thus, the support body 13, the isolating sleeve 29 and the capacitor plate 28 make up a feed-through which seals the vacuum system and enables the voltage present on the capacitor plate 26, located inside the vacuum system, to be capacitively coupled to a circuit outside the vacuum system attached to the post 33 of the capacitor plate 28.

The capacitor plate 26 includes a threaded hole 36 to provide for electrical connection to components within the vacuum enclosure. The threaded hole terminates with a through hole 37. The screw, not shown, used for electrical connection includes a hole so that the space between the capacitor plates 26 and 29 is evacuated by the vacuum system. Alternatively, a slot may be formed at either end of the standoff insulating sleeve 27 to provide communication to the vacuum system.

Insensitivity to temperature changes can be achieved by making the components from low-expansion materials in suitable combination. For example it is possible to use quartz or fused silica as the insulating material. The conductive components may be nickel iron alloys of a type known as Invar, which usually has the composition 36% Ni with the balance Fe. Other alloys which are insensitive to temperature changes may also be used. For example super Invar and Zerodur.

Another method of achieving temperature insensitivity is to make the structure so that it is self-compensating for a simple geometry. This may be done using materials such that the coefficient of thermal expansion of the insulating material is twice that of the conductive elements. Consider the case of a structure made from a conductive material with a coefficient of thermal expansion CTE of alpha. For a given increase in temperature this will result in the spacing between the electrodes increasing by 2 alpha, thus decreasing the capacitance by that amount Delta T time 2 alpha (since capacitance is inversely proportional to the spacing between the electrodes). However, the capacitance will increase by an amount approximately equal to Delta T times 2 alpha since the capacitance is proportional to the area of the capacitor plates and, in the case of small changes in area, the increase in area is approximately 2 times the change in length. It will be obvious that more complex geometries may be compensated using other values of the coefficient of thermal expansion.

A small-sized capacitor is achieved by putting the detector capacitor plates inside the vacuum system thus enabling the two plates of the capacitor to be much closer together than if they were at atmospheric pressure. The capacitor also combines the function of electrical feed-through and capacitor in one piece, thus avoiding the need for a second component and enabling the capacitor to be closely coupled to the detector circuit. The support body also acts as a ground shield preventing interference from reaching the circuit. The support body also shields the capacitor from variation in the surrounding geometry that may happen because of changes in system temperature. Temperature insensitivity is achieved both by the materials used in its construction, and because of the geometry of the structure.

Because the capacitor combines the function of feed-through and capacitor, it is mounted to the vacuum manifold and thermally coupled to it. This in turn means that it is temperature-stabilized by the large thermal mass of the vacuum manifold.

The foregoing descriptions of specific embodiments of the present invention are presented for the purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A capacitor adapted to be mounted on the wall of a vacuum enclosure including:

a support body adapted to be mounted on the wall of the vacuum enclosure, a first capacitor plate supported within the vacuum enclosure by a standoff insulator attached to the support body, and a second capacitor plate supported spaced from the first plate by an isolating insulator sealed to the support body and second capacitor plate, said capacitor plate providing a feed-through connection with the space between the first and second capacitor plates being at the vacuum pressure within said enclosure.

2. A capacitor as in claim 1 in which the standoff insulator is a sleeve.

3. A capacitor as in claim 1 or 2 in which said isolating insulator is the end of a cylindrical insulator or ring.

4. A capacitor as in claim 1 or 2 in which the materials for the support body, standoff insulator, sealed insulator and capacitor plates comprise materials having a low coefficient of thermal expansion.

5. A capacitor as in claim 1 or 2 in which the coefficient of thermal expansion and geometry of the standoff insulator and conductive elements is such that a structure which has a capacitance that is independent of temperature is achieved.

* * * * *